US012424574B2

(12) United States Patent
Zhou et al.

(10) Patent No.: US 12,424,574 B2
(45) Date of Patent: Sep. 23, 2025

(54) POLYMER COATED SEMICONDUCTOR DEVICES AND HYBRID BONDING TO FORM SEMICONDUCTOR ASSEMBLIES

(71) Applicant: Micron Technology, Inc., Boise, ID (US)

(72) Inventors: Wei Zhou, Boise, ID (US); Eiichi Nakano, Boise, ID (US); Ying Ta Chiu, Taichung (TW)

(73) Assignee: Micron Technology, Inc., Boise, ID (US)

( * ) Notice: Subject to any disclaimer, the term of this patent is extended or adjusted under 35 U.S.C. 154(b) by 364 days.

(21) Appl. No.: 17/820,199

(22) Filed: Aug. 16, 2022

(65) Prior Publication Data

US 2023/0065248 A1 Mar. 2, 2023

Related U.S. Application Data

(60) Provisional application No. 63/239,839, filed on Sep. 1, 2021.

(51) Int. Cl.
*H01L 21/56* (2006.01)
*H01L 21/683* (2006.01)
(Continued)

(52) U.S. Cl.
CPC ............ *H01L 24/08* (2013.01); *H01L 21/561* (2013.01); *H01L 21/565* (2013.01);
(Continued)

(58) Field of Classification Search
CPC ..... H01L 24/08; H01L 21/561; H01L 21/565; H01L 21/568; H01L 21/6835;
(Continued)

(56) References Cited

U.S. PATENT DOCUMENTS 9,397,078 B1 7/2016 Chandolu et al.
9,666,502 B2 * 5/2017 Chen ................. H01L 21/76831
(Continued)

FOREIGN PATENT DOCUMENTS

CN 113078147 A 7/2021

OTHER PUBLICATIONS

ROC (Taiwan) Patent Application No. 111132822—Office Action with English translation mailed Jun. 28, 2023, 15 pages.
(Continued)

*Primary Examiner* — Vu A Vu
(74) *Attorney, Agent, or Firm* — Dorsey & Whitney LLP

(57) ABSTRACT

A semiconductor device assembly including a first semiconductor device having a front side and a back side opposite of the front side, metal interconnects formed on the back side, and a polymer material deposited over the first semiconductor device to encapsulate the sidewalls, back side, and metal interconnects. The first semiconductor device is planarized to expose the upper surface of the metal interconnects. The assembly further includes a second semiconductor device having a top side and a bottom side opposite of the top side, a polymer material deposited over the second semiconductor device to encapsulate the sidewalls and bottom side. The second semiconductor device is stacked over the first device and hybrid bonded together such that each metal interconnect on the first semiconductor device back side aligns with and electrically couples to a corresponding metal interconnect on the second semiconductor device bottom side.

13 Claims, 5 Drawing Sheets

(51) Int. Cl.
  *H01L 21/78* (2006.01)
  *H01L 23/00* (2006.01)
  *H01L 25/00* (2006.01)
  *H01L 25/065* (2023.01)
(52) U.S. Cl.
  CPC ........ *H01L 21/568* (2013.01); *H01L 21/6835* (2013.01); *H01L 21/78* (2013.01); *H01L 24/80* (2013.01); *H01L 25/0657* (2013.01); *H01L 25/50* (2013.01); *H01L 2221/68327* (2013.01); *H01L 2224/08145* (2013.01); *H01L 2224/80006* (2013.01); *H01L 2224/80895* (2013.01); *H01L 2224/80896* (2013.01); *H01L 2225/06541* (2013.01); *H01L 2225/06586* (2013.01); *H01L 2924/04642* (2013.01); *H01L 2924/05042* (2013.01); *H01L 2924/05442* (2013.01); *H01L 2924/06* (2013.01); *H01L 2924/07025* (2013.01)
(58) Field of Classification Search
  CPC ..... H01L 21/78; H01L 24/80; H01L 25/0657; H01L 25/50; H01L 2221/68327; H01L 2224/08145; H01L 2224/80006; H01L 2224/80895; H01L 2224/80896; H01L 2225/06541; H01L 2225/06586; H01L 2924/04642; H01L 2924/05042; H01L 2924/05442; H01L 2924/06; H01L 2924/07025; H01L 21/6836; H01L 23/3114; H01L 23/3135; H01L 25/18; H01L 2225/06513; H01L 2225/06565

USPC ...................................................... 257/777
See application file for complete search history.

(56) References Cited

U.S. PATENT DOCUMENTS

| | | | | |
|---|---|---|---|---|
| 10,381,326 | B2* | 8/2019 | Woychik | H01L 24/02 |
| 11,101,240 | B2* | 8/2021 | Chung | H01L 25/0657 |
| 11,195,816 | B2* | 12/2021 | Yu | H01L 21/4853 |
| 11,244,939 | B2* | 2/2022 | Tsai | H01L 24/82 |
| 11,289,424 | B2* | 3/2022 | Wu | H01L 23/3128 |
| 11,728,314 | B2* | 8/2023 | Hsu | H01L 23/3135 257/621 |
| 12,131,974 | B2* | 10/2024 | Kao | H01L 23/49838 |
| 2020/0020634 | A1* | 1/2020 | Tsai | H01L 24/73 |
| 2020/0125698 | A1 | 4/2020 | Duggal et al. | |
| 2020/0350292 | A1 | 11/2020 | Agarwal et al. | |
| 2020/0411472 | A1 | 12/2020 | Chung et al. | |
| 2020/0411483 | A1* | 12/2020 | Uzoh | H01L 25/50 |
| 2021/0111156 | A1 | 4/2021 | Elsherbini et al. | |
| 2022/0093564 | A1* | 3/2022 | Chen | H01L 25/18 |
| 2022/0262783 | A1* | 8/2022 | Yu | H01L 25/0652 |

OTHER PUBLICATIONS

KR Patent Application No. 10-2022-0109853—Korean Office Action and Search Report, issued Sep. 25, 2024, with English Translation, 18 pages.

* cited by examiner

POLYMER COATED SEMICONDUCTOR DEVICES AND HYBRID BONDING TO FORM SEMICONDUCTOR ASSEMBLIES

CROSS-REFERENCE TO RELATED APPLICATION(S)

This application claims benefit of U.S. Provisional Application No. 63/239,839, filed Sep. 1, 2021; which is incorporated herein by reference in its entirety.

TECHNICAL FIELD

The present disclosure relates to polymer coated semiconductor devices, and more particularly relates to polymer coated semiconductor devices and hybrid bonding to form semiconductor assemblies.

BACKGROUND

The trend to manufacture ever smaller electronic devices has led to significantly thinner semiconductor devices densely packed with numerous semiconductor films and materials. The sidewalls of these thin and densely packed semiconductor devices are susceptible to damage during several manufacturing processes prior to being packaged into a semiconductor device assembly. Some of the manufacturing processes which introduce cracks, chips, or particulates in individual semiconductor devices that destroy the packaged semiconductor device assembly are outlined below. During a cleaning process to remove particulates and residue from semiconductor devices, slight cracks and cavities can form along the semiconductor device sidewalls. Further, during a dicing process to form individual semiconductor devices and a pick-up process to remove individual semiconductor devices from a carrier substrate, particulates can be introduced into the semiconductor device sidewalls and slight cracks or chipping can form along the semiconductor device sidewalls. Further, during a stacking process to form a semiconductor device assembly or package, chipping or cracks can form along the semiconductor device sidewalls. After these processes are completed, the stacked semiconductor devices are bonded together through, for example, a hybrid bonding process, in which generated particulates can lead to debonding, individual semiconductor device failure and/or progression of sidewall cracks which further damage the semiconductor device and cause the entire stack of the packaged semiconductor device assembly to fail.

Figure 1A:
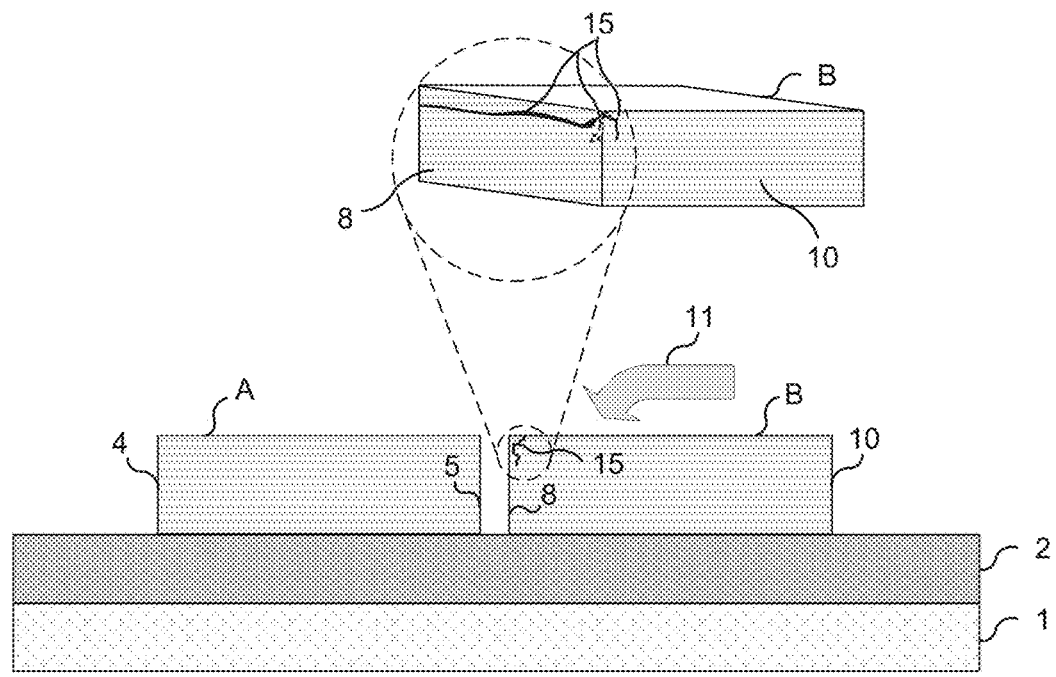
FIGS. 1A-1B are simplified schematic cross-sectional and plan views of sidewall chipping and cracks in processed semiconductor devices of the prior art.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

Figure 1B:
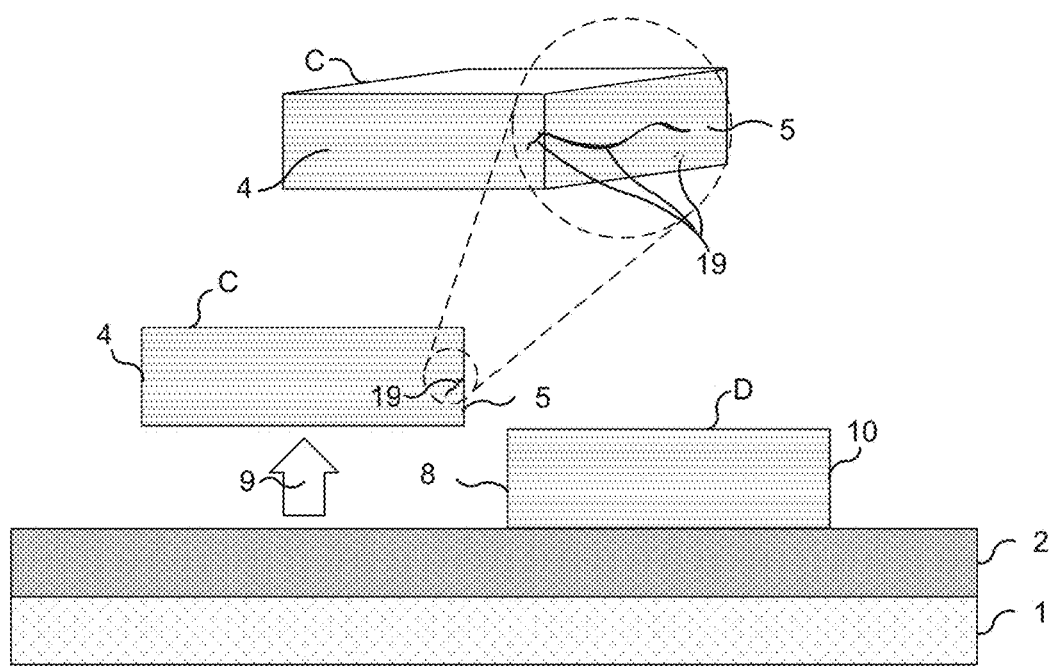

FIGS. 1A-1B are simplified schematic cross-sectional and plan views of sidewall chipping and cracks in processed semiconductor devices of the prior art. As can be seen with reference to FIG. 1A, a first semiconductor device A and second semiconductor device B are attached to a carrier substrate 1 through an adhesive 2 and subjected to a cleaning process 11. The carrier substrate 1 may be, for example, a carrier disk or glass substrate that retains semiconductor devices A, B during the cleaning process 11. While the cleaning process 11 removes most particulates, residue and surface contaminants that would damage semiconductor devices A, B further down the manufacturing process, the cleaning process 11 is abrasive and can etch into and damage silicon along the sidewalls 4, 5 of semiconductor device A and sidewalls 8, 10 of semiconductor device B. As illustrated in FIG. 1A, for example, the cleaning process 11 can lead to chip damages 15 (e.g. chipping, cracking, cavities and microfractures) in the sidewalls 8, 10 of the semiconductor devices B.

As can be seen with reference to FIG. 1B, a first semiconductor device C and second semiconductor device D are attached to a carrier substrate 1 through an adhesive 2 and subjected to a die pick-up process 9. The carrier substrate 1 may be, for example, a carrier disk or glass substrate that retains semiconductor devices C, D for individual die pick-up process 9. During the die pick-up process 9, sidewalls 4, 5 of the semiconductor device C and sidewalls 8, 10 of the semiconductor device D are subjected to additional forces that causes damage to the semiconductor device sidewalls. As illustrated in FIG. 1A, for example, the die pick-up process 9 applies enough force to sidewalls 4, 5 of the semiconductor devices B to cause chip degradation 19 (e.g. particulate contamination, tears and cracking).

The sidewall damage can progress throughout the manufacturing process and into the bonding and packaging of the semiconductor device. The microfractures progress into cracking, cavities progress into chipping, and so forth. This damage to each individual semiconductor device can jeopardize the entire stack of the packaged semiconductor device assembly causing failure in the semiconductor device assembly and leading to significant costs and lost time due to one damaged semiconductor device.

Embodiments of the present disclosure can address these problems and others by providing individual semiconductor devices with sidewall protection using materials and processes that are compatible with subsequent hybrid bonding operations. By protecting the sidewalls of individual devices after their singulation but before their removal from a carrier wafer, the foregoing difficulties of propagating microcracks, chips and cavities can be avoided and/or ameliorated, as is set forth in greater detail below.

FIGS. 2A-2E are simplified schematic cross-sectional views of processing exemplary semiconductor devices using polymer material in accordance with an embodiment of the present disclosure. As can be seen with reference to FIG. 2A, the back-side processing of device wafer 293 has been completed. The device wafer 293 includes front-side 201 and back-side 202, the front-side 201 may be attached to carrier substrate 290 by adhesive 291. The device wafer 293 may include material layer 292 formed on the front-side 201 along with a plurality of metal interconnects 208, 209, 228, and 229 formed in the material layer 292. Conductive (e.g., metallic) through silicon vias (TSVs) 210, 211, 230, and 231 are formed in device wafer 293 extending through the front-side 201 and back-side 202 of the device wafer 293 connecting each of a plurality of metal interconnects 212, 213, 232, and 233 formed on the back-side 202 with a corresponding one of the plurality of metal interconnects 208, 209, 228, and 229 formed on the front-side 201.

Examples of metals which could be used in the formation of TSVs 210, 211, 230, and 231, front-side metal interconnects 208, 209, 228, and 229, and back-side metal interconnects 212, 213, 232, and 233 include copper, aluminum, tungsten, tin, silver, gold or any of the six platinum metals (i.e., Ru, Rh, Pd, Os, Ir, or Pt). Any convenient deposition method may be used, including chemical vapor deposition (CVD), physical vapor deposition (PVD), e.g., sputtering, or electroplating.

Examples of material which could be used in the formation of the material layer 292 may be selected from one of silicon nitride, silicon carbide, silicide, silicon carbon nitride, silicon dioxide, polyimide, polybenzoxazole, or benzocyclobuten. Any convenient deposition method may be used, including spin coating, chemical vapor deposition (CVD), atomic layer deposition (ALD), vapor deposition polymerization (VDP), or physical vapor deposition (PVD).

Figure 2A:
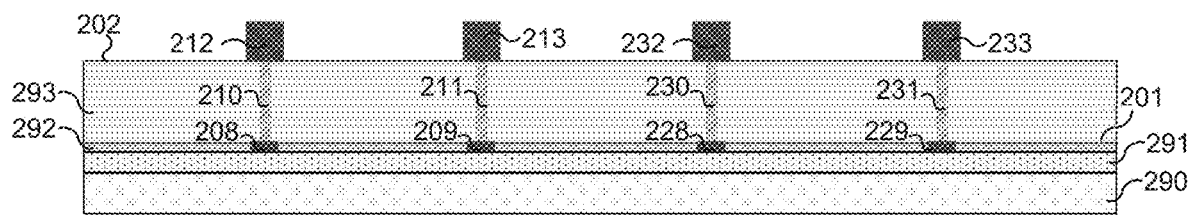
FIGS. 2A-2E are simplified schematic cross-sectional views of processing exemplary semiconductor devices using polymer material in accordance with an embodiment of the present disclosure.
Figure 2B:
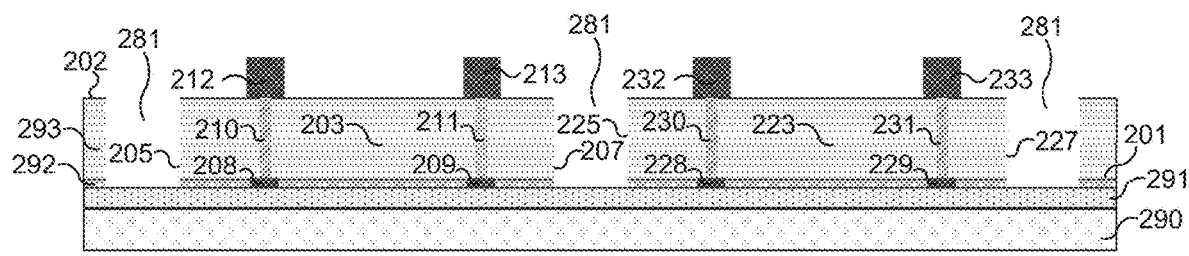

As can be seen with reference to FIG. 2B, device wafer 293 processing further includes dicing a plurality of semiconductor devices 203 and 223 to separate them from one another, removing material layer 292, creating saw streets or scribe lines 281 and thereby exposing sidewalls 205 and 207 for semiconductor device 203 and sidewalls 225, 227 for semiconductor device 223. Any convenient dicing method may be used, including one or more of plasma dicing, ion etching, laser cutting or blade dicing.

Figure 2C:
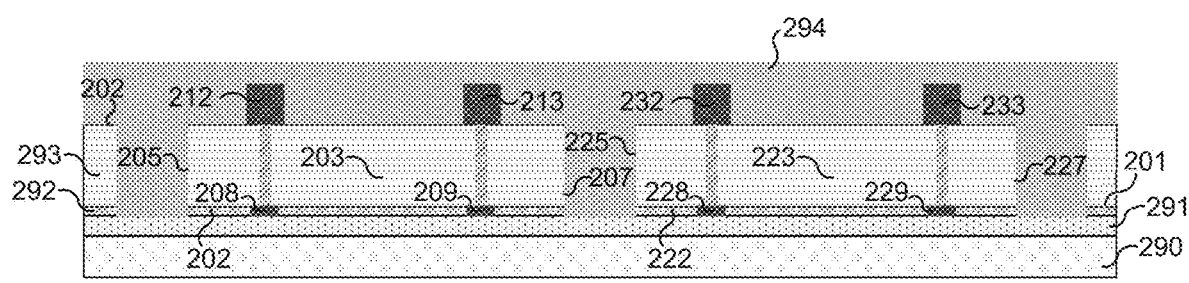

As can be seen with reference to FIG. 2C, the processing of device wafer 293 further includes depositing polymer material 294 over device wafer 293 including the scribe lines 281, metal interconnects 212, 213, 232, and 233, and the plurality of singulated semiconductor devices (e.g. semiconductor devices 203 and 223). The polymer material 294 directly encapsulates sidewalls 205, 207, 225 and 227 of semiconductor devices 203 and 223, respectively. Further, the polymer material 294 directly encapsulates metal interconnects 212, 213, 232, and 233. The polymer material 294 may further encapsulate back-side 202 of the device wafer 293 as well as top surfaces of adhesive 291. The polymer material 294 may include, in part or in whole, a single polymer material or composite polymer material(s) such as polyimide, polybenzoxazole, benzocyclobuten, or a combination thereof.

Although not illustrated in FIGS. 2A-2E, in some embodiments the front-side 201 of device wafer 293 may also be provided with a layer of a single or composite polymer material(s) that directly encapsulates the front-side 201 of device wafer 293, exposing the front-side metal interconnects 208, 209, 228, and 229. For example, metal interconnects 208, 209, 228, and 229 may be formed on the front-side 201 of device wafer 293 followed by deposition of a polymer material as the material layer 292 that directly encapsulates the front-side 201 of device wafer 293 and metal interconnects 208, 209, 228, and 229. The polymer material layer 292 and metal interconnects 208, 209, 228, and 229 may then be subjected to a patterning process and planarization before being attached to carrier substrate 291. Alternatively, polymer material layer 292 and metal interconnects 208, 209, 228, and 229 may be formed and processed on the front-side 201 after completion of process steps on back-side 202. Any convenient polishing or planarization method may be used, including chemical mechanical polishing (CMP), or spin-etch planarization (SEP). The polymer material layer 292 thickness may preferably be in a range of 5-6 um, and more preferably 3-4 um. The removal of portions of the polymer material layer 292 may be configured to allow a desired amount or thickness of polymer material to remain on the front-side 201 of device wafer 293 to protect semiconductor devices from damage during dicing, pick-up, stacking and hybrid bonding processes and to facilitate metal-metal interconnect connection in a front-back semiconductor device hybrid bonding process as shown in FIG. 3.

Figure 2D:
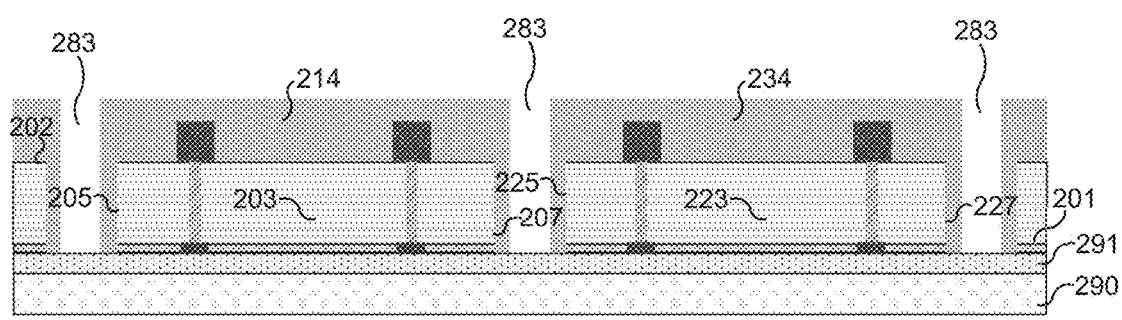
Figure 3:
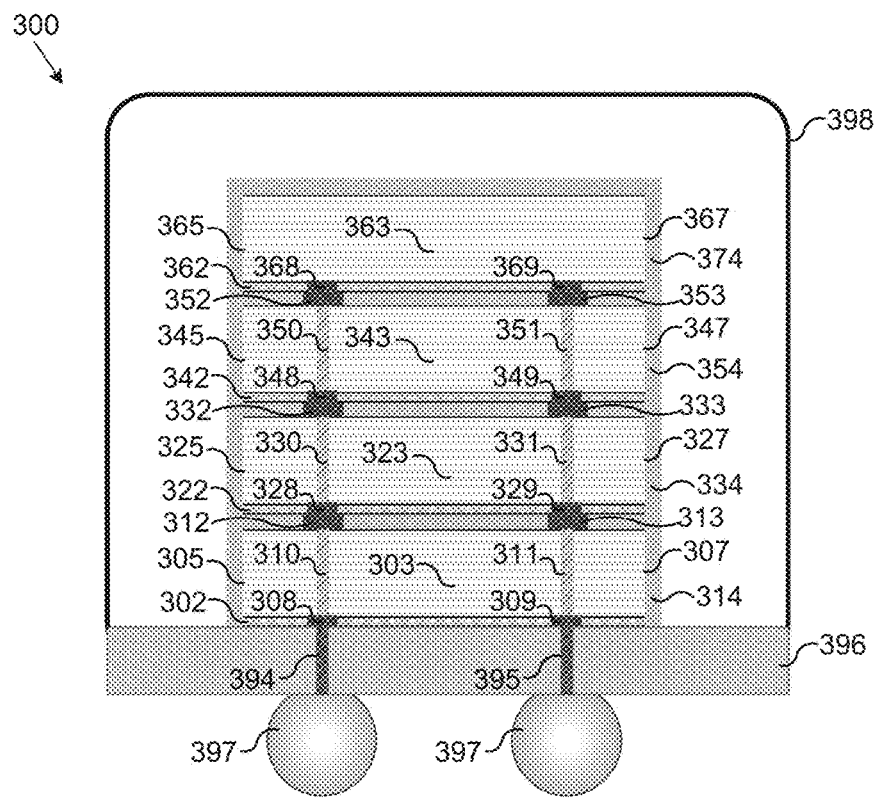
FIG. 3 is an exemplary packaged semiconductor device assembly in accordance with an embodiment of the present disclosure.

As can be seen with reference to FIG. 2D, the processing of device wafer 293 further includes the removal of a portion of the polymer material 294 to expose scribe lines 283 and the top surface of adhesive 291 while leaving remaining portions of the polymer material 214 and 234 on sidewalls 205, 207, 225 and 227 of semiconductor devices 203 and 223, respectively. Any convenient singulating method may be used to remove the portion of the polymer material and thereby separate the plurality of semiconductor devices, including one or more of laser removal or patterned etching. The removal of portions of the polymer material 294 may be configured to allow a desired amount or thickness of polymer material to remain on the sidewalls 205, 207, 225 and 227 to protect semiconductor devices from dicing, pick-up, stacking and hybrid bonding processes. For example, removing a portion of the polymer material 294 from adjacent semiconductor devices 203, 223 or along scribe lines 283 may reduce a thickness of the remaining portions of polymer material 214 and 234 to a range of about 20-35 um along the sidewalls 205, 207, 225 and 227 of each of the plurality of semiconductor devices 203 and 223, respectively. More particularly, the remaining portions 214 and 234 of polymer material along the sidewalls 205, 207, 225 and 227 of each of the plurality of semiconductor devices 203 and 223 may have a thickness in a range of 25-30 um, and more preferably a thickness of about 30 um.

Figure 2E:
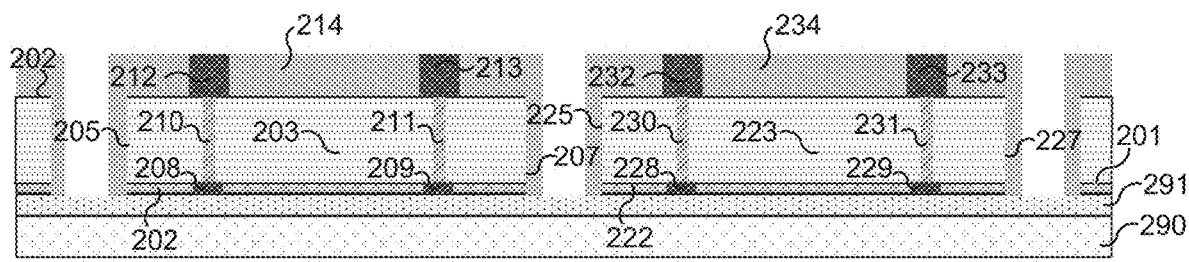

As can be seen with reference to FIG. 2E, processing of device wafer 293 may further include a planarization process to reduce a thickness of the polymer material 214 and 234 on the back-side 202 of device wafer 293 and to expose and optionally planarize metal interconnects 212, 213, 232, and 233. Any convenient polishing or planarization method may be used, including chemical mechanical polishing (CMP), or spin-etch planarization (SEP). The backside thickness of polymer material 214 and 234 may preferably be in a range of 5-6 um, and more preferably 3-4 um. The removal of portions of the polymer material 214 and 234 may be configured to allow a desired amount or thickness of polymer material to remain on the back-side 202 of device wafer 293 to protect semiconductor devices from damage during dicing, pick-up, stacking and hybrid bonding processes and to planarize metal interconnects 212, 213, 232, and 233 in order to facilitate metal-metal interconnect connection in a front-back semiconductor device hybrid bonding process, shown in greater detail below with reference to FIG. 3.

The polymer material 214, 234 and polymer material layer 292 is softer and more flexible than passivation layers, oxides, nitrides and carbides, e.g. silicon nitride, silicon carbide, silicon carbon nitride, silicide, silicon dioxide, or the like. Among other benefits and advantages, the flexibility of the polymer material 214, 234 and polymer material layer 292 provides better tolerance against CMP dishing and over planarization of metal (e.g. copper) interconnects. The polymer material is more compliant to a CMP process and does not require a precise or rigid planarization process to prevent excess removal/planarization of the metal interconnects. To the extent that some particulates remain on the bonding surface, the polymer material may be compliant enough to accommodate deformation around the particulates without the risk of delamination. Moreover, the polymer material can be spin coated on device wafer 293 allowing for easier deposition and better coverage of device wafer 293 and encapsulation of sidewalls 205, 207, 225 and 227, front-side metal interconnects 208, 209, 228, and 229, and back-side metal interconnects 212, 213, 232, and 233 of semiconductor devices 203 and 223. Moreover, the polymer material has advantages over more commonly used thermal bonding using passivation layers, oxides, nitrides and carbides, e.g. silicon nitride, silicon carbide, silicon carbon nitride, silicide, and silicon dioxide, due to its much lower operation temperature, lower pressure, lower load, as well as shorter time. Further, the polymer material 214, 234 and polymer material layer 292 will conform around the bond line during the hybrid bonding process. Furthermore, the polymer material 214, 234 and polymer material layer 292 is more tolerant to trapped particulates, contaminants, and residues in the polymer material throughout the dicing, pick-up, stacking and hybrid bonding processes.

Although front-side 201 and back-side 202 of device wafer 293 are described above as having polymer material, the material layer 292 on the front-side 201 may be made of any non-polymer to obtain the benefits described above. The material layer 292 may include, for example, passivation layer(s), oxides, nitrides and carbides, e.g. silicon nitride, silicon carbide, silicon carbon nitride, silicide, and silicon dioxide, or the like may be used as desired to obtain the benefits described above. That is, the benefits described above may be obtained by depositing polymer material on the back-side 202 of the device wafer 293, where polymer material 214 and 234 encapsulate back-side 202 of device wafer 293 and sidewalls 205, 207 and sidewalls 225, 227 of semiconductor devices 203 and 223, respectively.

FIG. 3 is an exemplary packaged semiconductor device assembly in accordance with an embodiment of the present disclosure. As can be seen with reference to FIG. 3, a plurality of semiconductor devices is stacked and hybrid bonded together forming packaged semiconductor assembly 300. The semiconductor assembly 300 includes a first semiconductor device 303 having sidewalls 305 and 307 and back-side metal interconnects 312 and 313 directly encapsulated by polymer material 314. The front-side metal interconnects 308 and 309 of the first semiconductor device 303 are stacked over and connected to the package contacts 394 and 395, respectively of a package substrate 396. The first semiconductor device 303 further includes metallic TSVs 310 and 311 connecting front-side metal interconnects 308 and 309 to back-side metal interconnects 312 and 313. The front-side metal interconnects 308 and 309 and front-side are encapsulated with material layer 302. As described above, the material layer 302 may be selected from one of silicon nitride, silicon carbide, silicide, silicon dioxide, polyimide, polybenzoxazole, or benzocyclobuten. The front-side and back-side of the first semiconductor device 303 may be planarized or polished to expose front-side metal interconnects 308 and 309 and back-side metal interconnects 312 and 313.

The semiconductor assembly 300 further includes a second semiconductor device 323 stacked over the first semiconductor device 303. The front-side metal interconnects 328 and 329 of the second semiconductor device 323 are stacked over and connected to the back-side metal interconnects 312 and 313, respectively of the first semiconductor device 303. The second semiconductor device 323 having sidewalls 325 and 327 and back-side metal interconnects 332 and 333 directly encapsulated by polymer material 334. The second semiconductor device 323 further includes metallic TSVs 330 and 331 connecting front-side metal interconnects 328 and 329 to back-side metal interconnects 332 and 333. The front-side metal interconnects 328 and 329 and front-side are encapsulated with material layer 322. As described above, the material layer 322 may be selected from one of silicon nitride, silicon carbide, silicide, silicon dioxide, polyimide, polybenzoxazole, or benzocyclobuten. The front-side and back-side of the first semiconductor device 323 may be planarized or polished to expose front-side metal interconnects 328 and 329 and back-side metal interconnects 332 and 333.

The semiconductor assembly 300 may further include a third semiconductor device 343 stacked over the second semiconductor device 323. The front-side metal interconnects 348 and 349 of the third semiconductor device 343 are stacked over and connected to the back-side metal interconnects 332 and 333, respectively of the second semiconductor device 323. The third semiconductor device 343 having sidewalls 345 and 347 and back-side metal interconnects 352 and 353 directly encapsulated by polymer material 354. The third semiconductor device 343 further includes metallic TSVs 350 and 351 connecting front-side metal interconnects 348 and 349 to back-side metal interconnects 352 and 353. The front-side metal interconnects 348 and 349 and front-side are encapsulated with material layer 342. As described above, the material layer 342 may be selected from one of silicon nitride, silicon carbide, silicide, silicon dioxide, polyimide, polybenzoxazole, or benzocyclobuten. The front-side and back-side of the first semiconductor device 343 may be planarized or polished to expose front-side metal interconnects 348 and 349 and back-side metal interconnects 352 and 353.

The semiconductor assembly 300 may further include a fourth semiconductor device 363 stacked over the third semiconductor device 343. The front-side metal interconnects 368 and 369 of the fourth semiconductor device 363 are stacked over and connected to the back-side metal interconnects 352 and 353, respectively of the third semiconductor device 343. The fourth semiconductor device 363 having sidewalls 365 and 367 directly encapsulated by polymer material 374. The front-side metal interconnects 368 and 369 and front-side are encapsulated with material layer 362. As described above, the material layer 362 may be selected from one of silicon nitride, silicon carbide, silicide, silicon dioxide, polyimide, polybenzoxazole, or benzocyclobuten. The front-side and back-side of the first semiconductor device 363 may be planarized or polished to expose front-side metal interconnects 368 and 369 and reduce the thickness of polymer material 374 as desired.

The semiconductor devices 303, 323, 343 and 363 are bonded together, for example through hybrid bonding then encapsulated in encapsulant 398. Solder balls 397 are formed in contact with the package contacts 394 and 395 of the package substrate 396 to form packaged semiconductor device assembly 300.

Figure 4:
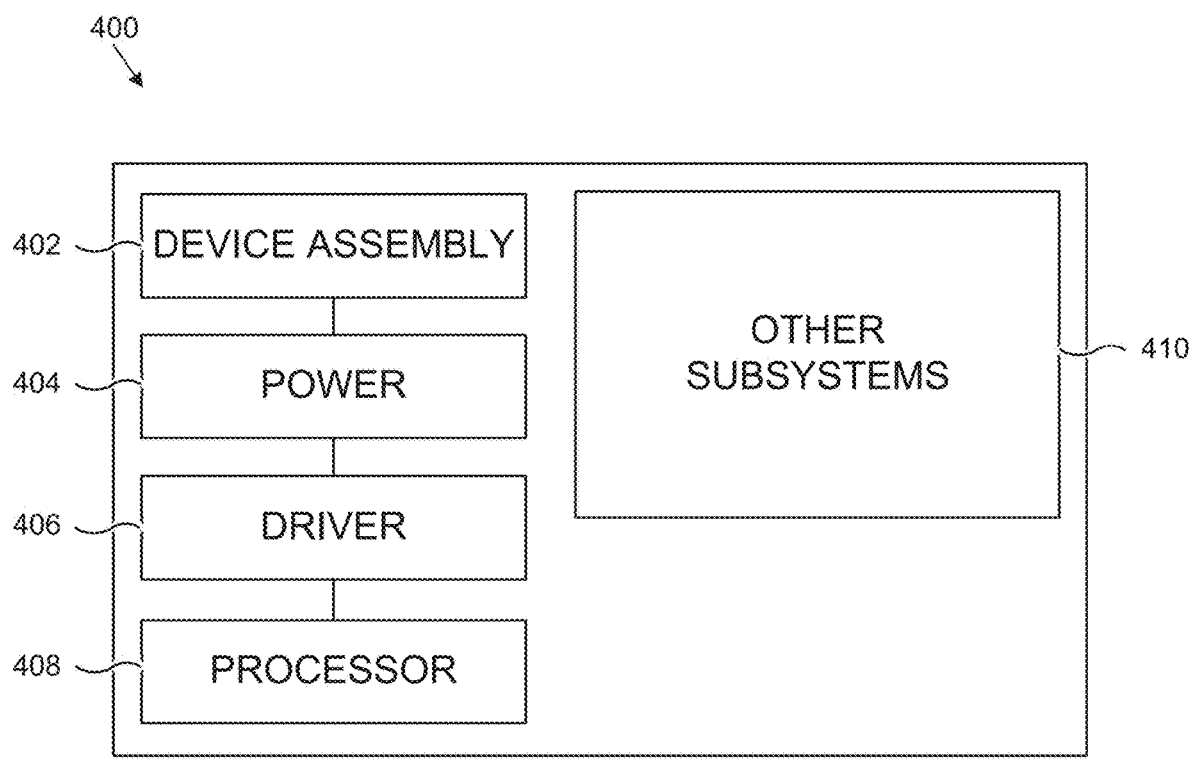
FIG. 4 is a schematic view showing an exemplary system that includes a semiconductor device assembly configured in accordance with an embodiment of the present disclosure.

FIG. 4 is a schematic view showing an exemplary system that includes a semiconductor device assembly configured in accordance with an embodiment of the present disclosure. Any one of the exemplary semiconductor devices and semiconductor device assemblies described above with reference to FIGS. 2A-2E and 3 may be incorporated into any of a myriad of larger and/or more complex systems, a representative example of which is system 400 shown schematically in FIG. 4. The system 400 may include semiconductor device assembly (e.g., or a discrete semiconductor device) 402, power source 404, driver 406, processor 408, and/or other subsystems or components 410. The semiconductor device assembly 402 may include features generally similar to those of the semiconductor devices described above with reference to FIGS. 2A-2E and 3. The resulting system 400 may perform any of a wide variety of functions, such as memory storage, data processing, and/or other suitable functions. Accordingly, representative systems 400 may include, without limitation, hand-held devices (e.g., mobile phones, tablets, digital readers, and digital audio players), computers, vehicles, appliances and other products. Components of the system 400 may be housed in a single unit or distributed over multiple, interconnected units (e.g., through a communications network). The components of the system 400 may also include remote devices and any of a wide variety of computer readable media.

Figure 5:
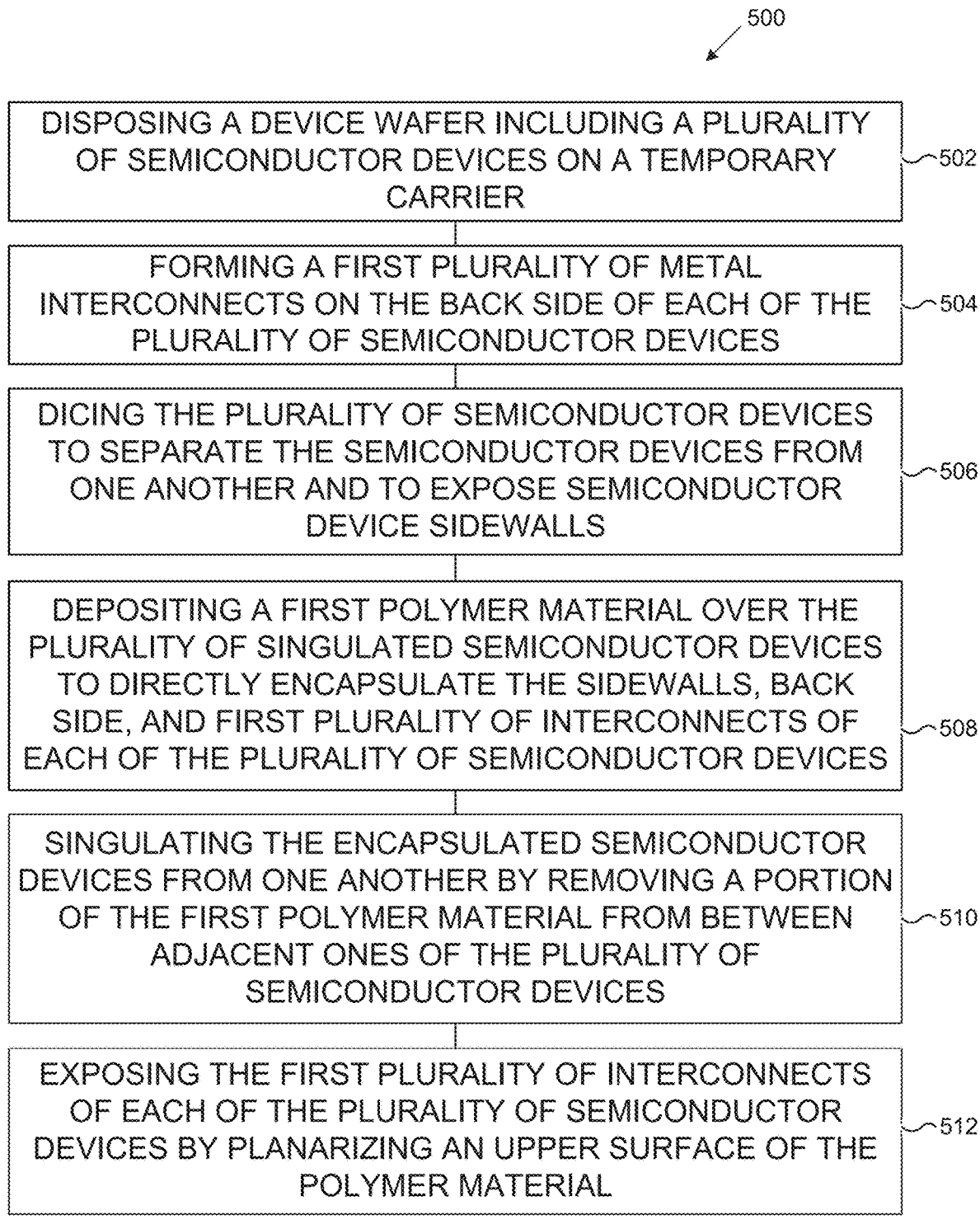
FIG. 5 is a flow chart illustrating an exemplary method of making a semiconductor device assembly in accordance with an embodiment of the present disclosure.

FIG. 5 is a flow chart illustrating an exemplary method of making a semiconductor device assembly. The exemplary method is provided by way of example, as there are a variety of ways to carry out the method. Each box shown in FIG. 5 represents one or more processes, methods or subroutines, carried out in the exemplary method. FIGS. 2A-2E and 3 show exemplary embodiments of carrying out the method of FIG. 5. The exemplary method may begin at box 502. Further for explanatory purposes, the boxes of the example process 500 are described herein as occurring in serial, or linearly. However, multiple boxes of the example process 500 may occur in parallel. In addition, the boxes of the example process 500 may be performed a different order than the order shown and/or one or more of the boxes of the example process 500 may not be performed.

The exemplary method of FIG. 5 includes disposing a device wafer including a plurality of semiconductor devices on a temporary carrier (box 502), where each of the plurality of semiconductor devices has a front side facing the temporary carrier and a back side opposite of the front side.

The method further includes forming a first plurality of metal interconnects on the back side of each of the plurality of semiconductor devices (box 504). In some exemplary embodiments, forming metal interconnects may include depositing one or more of copper, aluminum, tungsten, tin, silver, or gold.

The method further includes dicing the plurality of semiconductor devices to separate the semiconductor devices from one another and to expose sidewalls thereof (box 506). In some exemplary embodiments, dicing process may include one or more of plasma dicing, laser cut or blade dicing.

The method further includes depositing a first polymer material over the plurality of singulated semiconductor devices such that the polymer material directly encapsulates the sidewalls, back side, and first plurality of interconnects of each of the plurality of semiconductor devices (box 508). In some exemplary embodiments, the first polymer material may be selected from polyimide, polybenzoxazole, benzocyclobuten, or a combination thereof. The polymer material has more elastic properties compared to non-organic passivation layer and higher tolerance of particulates, surface roughness and copper dishing in a chemical mechanical polishing. The polymer material may deposited on the front or top side of the semiconductor device in addition to the sidewalls and back side of the semiconductor device to provide higher tolerance to cracking, chipping and particulate contamination of the semiconductor device in the manufacturing process (e.g. dicing and pick-up process) as well as protecting the semiconductor device and assemblies from cracking or chipping in the stacking and hybrid bonding processes.

The method further includes singulating the encapsulated semiconductor devices from one another by removing a portion of the first polymer material from between adjacent ones of the plurality of semiconductor devices (box 510). In some exemplary embodiments, the first polymer material between each of the plurality of semiconductor devices may be removed by laser removal or patterned etching. Further, the process of removing the portion of the first polymer material reduces a thickness of the first polymer material along the sidewalls of each of the plurality of semiconductor devices to about 30 um.

The method further includes exposing the first plurality of interconnects of each of the plurality of semiconductor devices by planarizing an upper surface of the polymer material (box 512). The planarization process may use chemical mechanical polishing (CMP) or fly cut to planarize the polymer surface and expose the metal interconnects. In some exemplary embodiments, planarizing the first polymer material reduces a thickness of the first polymer material over the back side of the plurality of semiconductor devices to about 4 um.

In some exemplary embodiments, the method may further include forming a second material on the front side of each of the plurality of semiconductor devices and forming a second plurality of metal interconnects in the second material, wherein each of the second plurality of metal interconnects aligns with a corresponding one of the first plurality of metal interconnects. Further, the second material may be selected from one of silicon nitride, silicon carbide, silicide, silicon dioxide, polyimide, polybenzoxazole, or benzocyclobuten.

The method may further include forming a semiconductor device assembly by stacking a subset of the plurality of semiconductor devices by hybrid bonding. In some exemplary embodiments, the individual semiconductor devices are removed from the temporary carrier substrate by adhesive debonding, followed by cleaning and pick up for polymer hybrid bonding.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" may refer to relative directions or positions of features in the semiconductor devices in view of the orientation shown in the Figures. For example, "upper" or "uppermost" may refer to a feature positioned closer to the top of a page than another feature. These terms, however, should be construed broadly to include semiconductor devices having other orientations, such as inverted or inclined orientations where top/bottom, over/under, above/below, up/down, and left/right may be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the present disclosure have been described herein for purposes of illustration, but that various modifications may be made without deviating from the scope of the present disclosure. Rather, in the foregoing description, numerous specific details are discussed to provide a thorough and enabling description for embodiments of the present disclosure. One skilled in the relevant art, however, will recognize that the disclosure may be practiced without one or more of the specific details. In other instances, well-known structures or operations often associated with memory systems and devices are not shown, or are not described in detail, to avoid obscuring other aspects of the present disclosure. In general, it should be understood that various other devices, systems, and methods in addition to those specific embodiments disclosed herein may be within the scope of the present disclosure.

What is claimed:
1. A semiconductor device assembly comprising:
   a first semiconductor device including:
      a first semiconductor substrate having (1) a front side, (2) a back side opposite of the front side, and (3) sidewalls,
      a first plurality of metal interconnects formed on the back side, and
      a first polymer material encapsulating the sidewalls and the back side, the first polymer material on the sidewalls forms first vertical outer surfaces that correspond to peripheral boundaries for the first semiconductor device,
      wherein the first polymer material is planarized to expose upper surfaces of the first plurality of metal interconnects;
   a second semiconductor device including:
      a second semiconductor substrate having (1) a top side, (2) a bottom side opposite of the top side, and (3) vertical walls,
      a second polymer material encapsulating the vertical walls and the bottom side, the second polymer material on the vertical walls forms second vertical outer surfaces that correspond to peripheral boundaries for the second semiconductor device;

a third material deposited on the top side of the second semiconductor device where a second plurality of metal interconnects is formed;

wherein the second semiconductor device is stacked over the first semiconductor device such that:

each of the second plurality of metal interconnects aligns with and electrically couples to a corresponding one of the first plurality of metal interconnects, and the first vertical outer surfaces of the first semiconductor device and the second vertical outer surfaces of the second semiconductor device are aligned; and wherein the first and second semiconductor device are hybrid bonded together.

2. The semiconductor device assembly of claim 1, wherein the first and second polymer materials are selected from the group consisting of polyimide, polybenzoxazole, and benzocyclobuten.

3. The semiconductor device assembly of claim 1, wherein the first and second polymer material thickness along the sidewalls and the vertical walls of the first and second semiconductor device is about 30 um.

4. The semiconductor device assembly of claim 1, wherein the first polymer material thickness over the back side of the first semiconductor device is about 4 um and the second polymer material thickness over bottom side of the second semiconductor device is about 4 um.

5. The semiconductor device assembly of claim 1, further comprising a fourth material deposited over the front side of the first semiconductor device and a third plurality of metal interconnects formed in the second material, wherein each of the third plurality of metal interconnects aligns with a corresponding one of the first plurality of metal interconnects.

6. The semiconductor device assembly of claim 5, wherein the third and fourth material is one of silicon nitride, silicon carbide, silicide, silicon dioxide, polyimide, polybenzoxazole, or benzocyclobuten.

7. A method of making a semiconductor device assembly, the method comprising:

disposing a device wafer including a plurality of semiconductor devices on a temporary carrier, each of the plurality of semiconductor devices having a front side facing the temporary carrier and a back side opposite of the front side;

forming through silicon vias (TSVs) on the backside and extending toward the front side;

forming a first plurality of metal interconnects on the back side of each of the plurality of semiconductor devices, the first plurality of metal interconnects electrically coupled to and overlapping the TSVs;

dicing the device wafer to separate the semiconductor devices from one another and to expose sidewalls thereof;

depositing a first polymer material over the plurality of singulated semiconductor devices such that the polymer material directly encapsulates the sidewalls, the back side, and the first plurality of metal interconnects of each of the plurality of semiconductor devices, wherein the first polymer material on the sidewalls forms outer vertical walls of each of the semiconductor devices, wherein the semiconductor devices having a common width measured between the outer vertical walls;

singulating the encapsulated semiconductor devices from one another by removing a portion of the first polymer material from between the outer vertical walls of adjacent semiconductor devices, wherein removing the portion of the first polymer material reduces a thickness of the first polymer material along the sidewalls of each of the plurality of semiconductor devices to about 30 um; and exposing the first plurality of metal interconnects of each of the plurality of semiconductor devices by planarizing an upper surface of the polymer material.

8. The method of claim 7, wherein the first polymer material is selected from the group consisting of polyimide, polybenzoxazole, and benzocyclobuten.

9. The method of claim 7, wherein the first polymer material between each of the plurality of semiconductor devices is removed by laser removal or patterned etching.

10. The method of claim 7, wherein planarizing the first polymer material reduces a thickness of the first polymer material over the back side of the plurality of semiconductor devices to about 4 um.

11. The method of claim 7, further comprising forming a second material on the front side of each of the plurality of semiconductor devices and forming a second plurality of metal interconnects in the second material, wherein each of the second plurality of metal interconnects aligns with a corresponding one of the first plurality of metal interconnects.

12. The method of claim 11, wherein the second material is one of silicon nitride, silicon carbide, silicide, silicon dioxide, polyimide, polybenzoxazole, or benzocyclobuten.

13. The method of claim 11, further comprising stacking a subset of the plurality of semiconductor devices by hybrid bonding.

* * * * *